United States Patent
Ranish et al.

(10) Patent No.: US 9,748,121 B2
(45) Date of Patent: Aug. 29, 2017

(54) THERMAL COUPLED QUARTZ DOME HEAT SINK

(71) Applicant: Applied Materials, Inc., Santa Clara, CA (US)

(72) Inventors: Joseph M. Ranish, San Jose, CA (US); Mehmet Tugrul Samir, Mountain View, CA (US); Paul Brillhart, Pleasanton, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 802 days.

(21) Appl. No.: 14/175,459

(22) Filed: Feb. 7, 2014

(65) Prior Publication Data

US 2014/0254150 A1 Sep. 11, 2014

Related U.S. Application Data

(60) Provisional application No. 61/772,618, filed on Mar. 5, 2013.

(51) Int. Cl.
*H01L 21/00* (2006.01)
*H01L 21/67* (2006.01)
(Continued)

(52) U.S. Cl.
CPC .... *H01L 21/67115* (2013.01); *C23C 16/4411* (2013.01); *C23C 16/463* (2013.01)

(58) Field of Classification Search
CPC ............... H01L 21/67115; C23C 16/00; C23C 16/4411; C23C 16/46; C23C 16/463; A21B 2/00
(Continued)

(56) References Cited

U.S. PATENT DOCUMENTS 5,108,792 A * 4/1992 Anderson ............... C23C 16/44
 118/715
5,258,824 A * 11/1993 Carlson .................. G01B 15/02
 250/339.01

(Continued)

FOREIGN PATENT DOCUMENTS

JP 2008-130888 A 6/2008

OTHER PUBLICATIONS

International Search Report and Written Opinion dated Dec. 19, 2014 for Application No. PCT/US2014/015731.

*Primary Examiner* — Devon Russell
(74) *Attorney, Agent, or Firm* — Patterson + Sheridan LLP

(57) ABSTRACT

Embodiments described herein generally relate to apparatus for processing substrates. The apparatus generally include a process chamber having a substrate support therein. A plurality of lamps are positioned to provide radiant energy through an optically transparent window to a substrate positioned on the substrate support. The plurality of lamps are positioned in a lamp housing. A cooling channel is formed in the lamp housing. A surface of the lamp housing is spaced a distance from the optically transparent window to form a gap therebetween. The gap functions as a fluid channel and is adapted to contain a fluid therein to facilitate cooling of the optically transparent window. Turbulence inducing features, such as openings, formed in the surface of the lamp housing induce a turbulent flow of the cooling fluid, thus improving heat transfer between the optically transparent window and the lamp housing.

15 Claims, 4 Drawing Sheets

(51) Int. Cl.
*C23C 16/44* (2006.01)
*C23C 16/46* (2006.01)

(58) Field of Classification Search
USPC .......................................... 165/80.4
See application file for complete search history.

(56) References Cited

U.S. PATENT DOCUMENTS

| | | | | |
|---|---|---|---|---|
| 5,755,886 | A * | 5/1998 | Wang | C23C 16/402 |
| | | | | 118/715 |
| 5,792,269 | A * | 8/1998 | Deacon | C23C 16/45565 |
| | | | | 118/715 |
| 5,855,677 | A * | 1/1999 | Carlson | C23C 16/4405 |
| | | | | 118/666 |
| 5,937,142 | A * | 8/1999 | Moslehi | C23C 16/481 |
| | | | | 118/725 |
| 6,367,410 | B1 | 4/2002 | Leahey et al. | |
| 6,635,117 | B1 * | 10/2003 | Kinnard | C23C 16/4411 |
| | | | | 118/723 R |
| 6,666,924 | B1 * | 12/2003 | van Bilsen | C23C 16/4401 |
| | | | | 118/715 |
| 7,378,618 | B1 | 5/2008 | Sorabji et al. | |
| 2005/0000423 | A1 * | 1/2005 | Kasai | C23C 16/45565 |
| | | | | 118/715 |
| 2005/0003600 | A1 * | 1/2005 | Kasai | C23C 16/14 |
| | | | | 438/200 |
| 2007/0042117 | A1 * | 2/2007 | Kuppurao | C23C 16/4411 |
| | | | | 427/248.1 |
| 2007/0077355 | A1 | 4/2007 | Chacin et al. | |
| 2008/0156462 | A1 * | 7/2008 | Arik | F04B 43/04 |
| | | | | 165/80.4 |
| 2009/0010626 | A1 | 1/2009 | Ramamurthy et al. | |
| 2009/0272719 | A1 | 11/2009 | Collins et al. | |
| 2011/0308551 | A1 | 12/2011 | Chung et al. | |

\* cited by examiner

THERMAL COUPLED QUARTZ DOME HEAT SINK

CROSS-REFERENCE TO RELATED APPLICATIONS

This application claims benefit of U.S. Provisional Patent Application Ser. No. 61/772,618, filed Mar. 5, 2013, which is herein incorporated by reference.

BACKGROUND OF THE INVENTION

Field of the Invention

Embodiments of the present invention generally relate to methods and apparatus for heating substrates, such as semiconductor substrates.

Description of the Related Art

Semiconductor substrates are processed for a wide variety of applications, including the fabrication of integrated devices and microdevices. One method of processing substrates includes depositing a material, for example, an epitaxial material, on a substrate surface. Deposited film quality is dependent upon several factors, including process conditions such as temperature. As transistor size decreases, temperature control becomes more important in forming high quality films. Temperature control becomes more difficult as throughput increases, particularly due to the demands of rapid substrate temperature increases and decreases (e.g., substrate ramp up and cool down). The substrate heating rate can be increased by adjusting lamp settings. However, substrate cooling is largely dependent on the ambient temperature, which may be difficult or expensive to reduce. To further exacerbate cooling issues, the ambient temperature in close proximity to a substrate is influenced by heated chamber components, particularly a heated lower dome. The absorbed heat radiates to a substrate during cooling, which undesirably extends the time to sufficiently cool a substrate.

Therefore, there is a need for improved cooling.

SUMMARY OF THE INVENTION

Embodiments described herein generally relate to apparatus for processing substrates. The apparatus generally include a process chamber having a substrate support therein. A plurality of lamps are positioned to provide radiant energy through an optically transparent window to a substrate positioned on the substrate support. The plurality of lamps are positioned in a lamp housing. A cooling channel is formed in the lamp housing. A surface of the lamp housing is spaced a distance from the optically transparent window to form a gap therebetween. The gap functions as a fluid channel and is adapted to contain a fluid therein to facilitate cooling of the optically transparent window. Turbulence inducing features, such as openings, formed in the surface of the lamp housing induce a turbulent flow of the cooling fluid, thus improving heat transfer between the optically transparent window and the lamp housing.

In one embodiment, a process chamber comprises a chamber body including an optically transparent window and a lamp housing disposed adjacent to the optically transparent window. A gap is formed between the optically transparent window and the lamp housing. A plurality of lamps and one or more cooling channels are disposed within the lamp housing. The process chamber also includes a cooling fluid source adapted to provide a cooling fluid to the gap between the optically transparent window and the lamp housing.

In another embodiment, a method of cooling comprises circulating a cooling fluid within a space between an optically transparent window and a lamp housing having at least one cooling channel formed therein. A surface of the lamp housing includes one or more turbulence inducing features to cause a turbulent flow of the cooling fluid. The cooling fluid thermally couples the optically transparent window and the at least one cooling channel.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments described herein generally relate to apparatus for processing substrates. The apparatus generally include a process chamber having a substrate support therein. A plurality of lamps are positioned to provide radiant energy through an optically transparent window to a substrate positioned on the substrate support. The plurality of lamps are positioned in a lamp housing. A cooling channel is formed in the lamp housing. A surface of the lamp housing is spaced a distance from the optically transparent window to form a gap therebetween. The gap functions as a fluid channel and is adapted to contain a fluid therein to facilitate cooling of the optically transparent window. Turbulence inducing features, such as openings, formed in the surface of the lamp housing induce a turbulent flow of the cooling fluid, thus improving heat transfer between the optically transparent window and the lamp housing.

Figure 1:
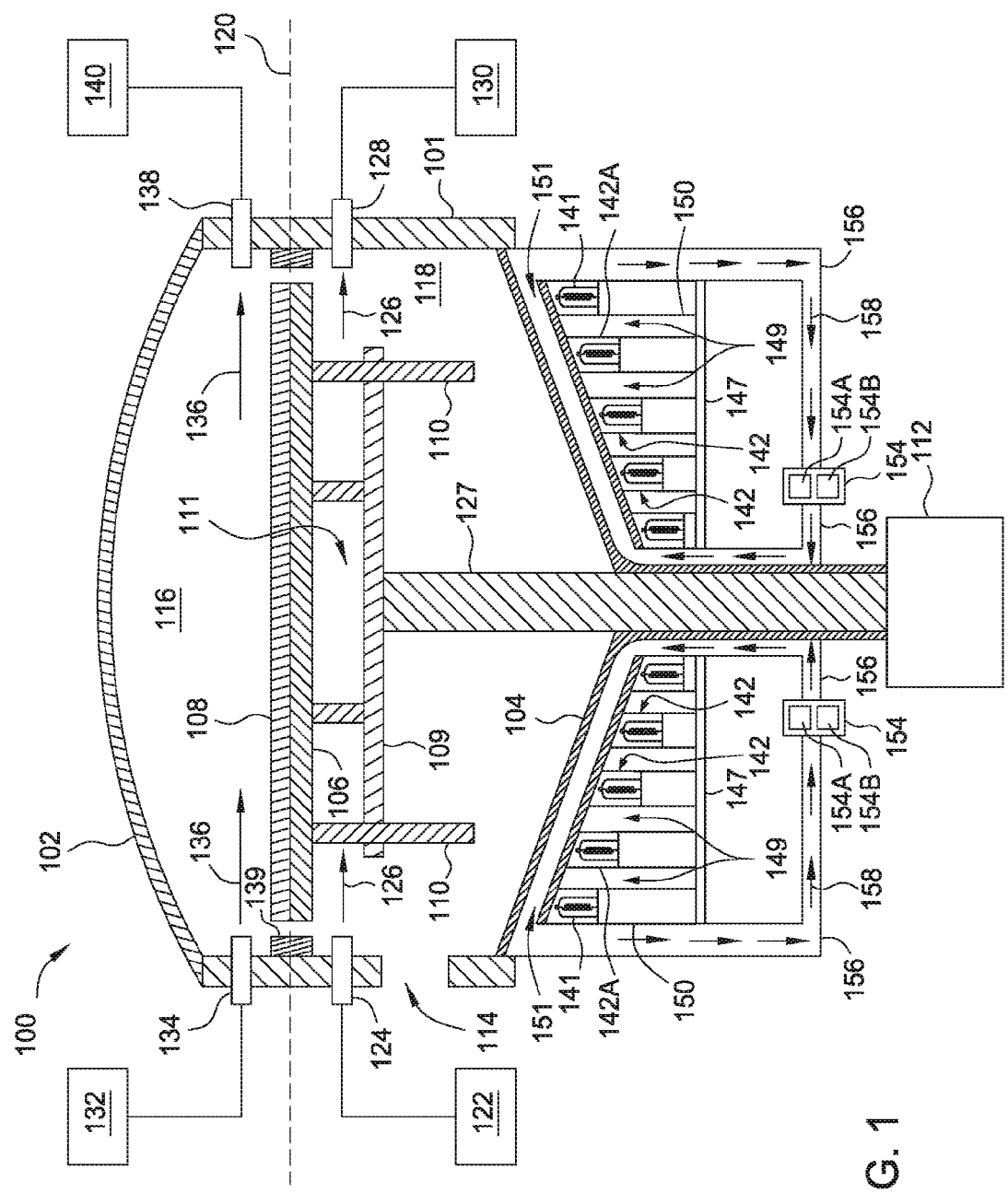
FIG. 1 is a schematic sectional view of a process chamber according to one embodiment of the invention.

FIG. 1 is a schematic sectional view of a process chamber 100 according to one embodiment of the invention. The process chamber 100 may be used to process one or more substrates, including the deposition of a material on an upper surface of a substrate. The process chamber 100 includes a chamber body 101 and a lid or upper dome 102 formed from a material such as a stainless steel, aluminum, ceramics (e.g., quartz), or coated metals or ceramics. The process chamber 100 also includes a window 104, such as a lower dome, formed from an optically transparent material such as quartz. The optically transparent window 104 is coupled to, or is an integral part of, the chamber body 101. A substrate support 106 adapted to support a substrate 108 thereon is disposed within the process chamber 100 between the upper dome 102 and the optically transparent window 104. The substrate support 106 is coupled to a support plate 109 and forms a gap 111 therebetween. The support plate 109 is formed from an optically transparent material, such as quartz, to allow radiant energy from lamps 142 to impinge upon and heat the substrate support 106 to a desired processing temperature. The substrate support 106 is formed from silicon carbide or graphite coated with silicon carbide to absorb radiant energy from the lamps 142 and transfer the radiant energy to the substrate 108.

The substrate support 106 is shown in an elevated processing position, but may be vertically actuated by an actuator 112 to a loading position below the processing position to allow lift pins 110 to contact the optically transparent window 104 and raise the substrate 108 from the substrate support 106. A robot (not shown) may then enter the process chamber 100 to engage and remove the substrate 108 therefrom through an opening 114, such as a slit valve. The substrate support 106 is also adapted to be rotated during processing by the actuator 112 to facilitate uniform processing of the substrate 108.

The substrate support 106, while located in the processing position, divides the internal volume of the process chamber 100 into a process gas region 116 and a purge gas region 118. The process gas region 116 includes the internal chamber volume located between the upper dome 102 and a plane 120 of the substrate support 106 while the substrate support 106 is located in the processing position. The purge gas region 118 includes the internal chamber volume located between the optically transparent window 104 and the plane 120.

Purge gas supplied from a purge gas source 122 is introduced to the purge gas region 118 through a purge gas inlet 124 formed within a sidewall of the chamber body 101. The purge gas flows laterally along flow path 126 across the back surface of the support 106, and is exhausted from the purge gas region 118 through a purge gas outlet 128 located on the opposite side of the process chamber 100 as the purge gas inlet 124. An exhaust pump 130, coupled to the purge gas outlet 128, facilitates removal of the purge gas from the purge gas region 118.

Process gas supplied from a process gas supply source 132 is introduced into the process gas region 116 through a process gas inlet 134 formed in a sidewall of the chamber body 101. The process gas flows laterally across the upper surface of the substrate 108 along flow path 136. The process gas exits the process gas region 116 through a process gas outlet 138 located on the opposite side of the process chamber 100 as the process gas inlet 134. Removal of the process gas through the process gas outlet 138 is facilitated by a vacuum pump 140 coupled thereto.

Multiple lamps 142 are disposed adjacent to and beneath the optically transparent window 104 to heat the substrate 108 as the process gas passes thereover to facilitate the deposition of a material onto the upper surface of the substrate 108. The lamps 142 are positioned in a lamp housing 150, formed from, for example, copper, aluminum, or stainless steel. The lamps include bulbs 141 surrounded by an optional reflector 142A. Each lamp 142 is coupled to a power distribution board 147 through which power is supplied to each lamp 142. The lamps 142 are arranged in annular groups of increasing radius around a shaft 127 of the substrate support 106. The shaft 127 is formed form quartz or another optically transparent material.

An upper surface of the lamp housing 150 is positioned in a spaced apart orientation from the optically transparent window 104 to form a gap 151 therebetween. In one example, the gap 151 may be about 0.5 millimeters to about 10 millimeters, or more. In one example, the gap 151 is about 6 millimeters. The gap 151 is in fluid communication with a temperature control unit 154. The temperature control unit 154 contains a fluid, a fluid source, or a connection to an external fluid source, and provides a cooling fluid, such as a gas, to the gap 151 through piping 156, as shown by flow path 158. The temperature control unit 154 may optionally include a forced induction unit 154A, such as a fan or jet pack, as well as a heat exchanger 1548 to remove heat from the circulating cooling fluid. While the cooling fluid is located in the gap 151, the cooling fluid facilitates heat transfer from the optically transparent window 104 to cooling channels 149 within the lamp housing 150. Thus, heat is removed from the optically transparent window 104, which further increases the rate of cooling of the substrate 108 by reducing the radiation of heat from the optically transparent window 104 to the substrate 108. The cooling fluid is recycled to the temperature control unit 154 for reuse, as shown by the flow path 158. The cooling channels 149 are not only utilized to remove thermal energy from the optically transparent window 104, but also to cool the lamps 142. Because only one set of cooling channels 149 are utilized to cool both the optically transparent window 104 and the lamps 142, manufacturing costs of the process chamber 100 are reduced.

The lamps 142 are adapted to the heat the substrate to a predetermined temperature to facilitate thermal decomposition of the process gas onto the surface of the substrate 108. In one example, the material deposited onto the substrate may be a group III, group IV, and/or group V material, or may be a material including a group III, group IV, and/or group V dopant. For example, the deposited material may include gallium arsenide, gallium nitride, or aluminum gallium nitride. The lamps may be adapted to heat the substrate to a temperature within a range of about 300 degrees Celsius to about 1200 degrees Celsius, such as about 300 degrees Celsius to about 950 degrees Celsius.

Although FIG. 1 illustrates one embodiment of a process chamber, additional embodiments are also contemplated. For example, in another embodiment, it is contemplated that the substrate support 106 may be formed from an optically transparent material, such as quartz, to allow for direct heating of the substrate 108. In yet another embodiment, it is contemplated that an optional circular shield 139 may be disposed around the substrate support 106 and coupled to a sidewall of the chamber body 101. In another embodiment, the process gas supply source 132 may be adapted to supply multiple types of process gases, for example, a group III precursor gas and a group V precursor gas. The multiple process gases may be introduced into the chamber through the same process gas inlet 134, or through different process gas inlets 134. Additionally, it is also contemplated that the size, width, and/or number of gas inlets 124, 134, or gas outlets 128, 138 may be adjusted to further facilitate a uniform deposition of material on the substrate 108.

In another embodiment, the substrate support 106 may be an annular ring or edge ring having a central opening therethrough, and may be adapted to support the perimeter of the substrate 108. In such an embodiment, the substrate support 106 may be formed from silicon carbide, silicon-carbide-coated graphite, or glassy-carbon-coated graphite.

Figure 2A:
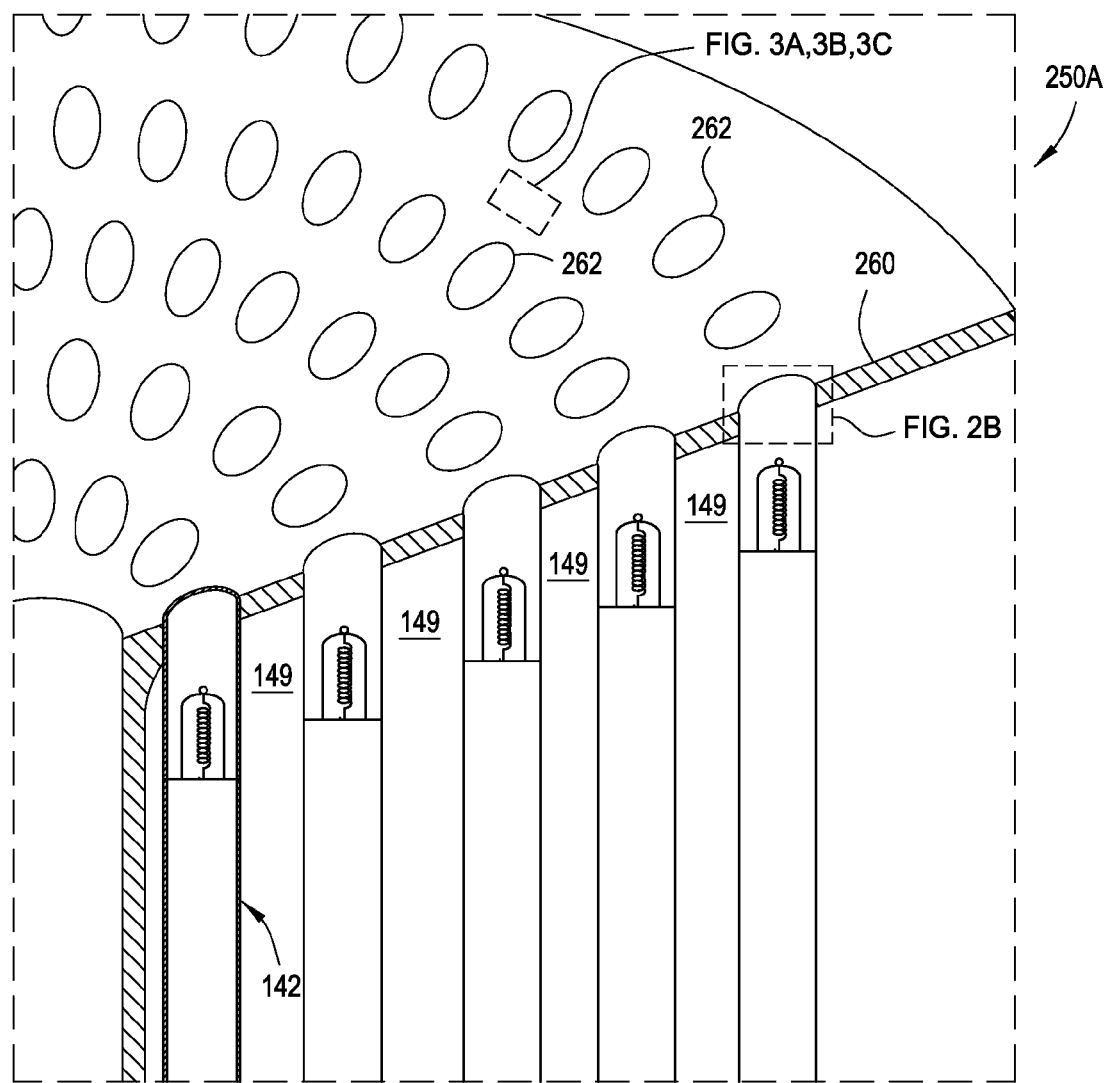
FIG. 2A is a partial sectional schematic view of an upper surface of lamp housings, according to embodiments of the invention.

FIG. 2A is a partial sectional schematic view of an upper surface 260 of a lamp housing 250A. The lamp housing 250A is similar to lamp housing 150 and may be used in place thereof. The upper surface 260 includes features, such as openings 262, formed therein. The openings 262 allow radiant energy from the lamps 142 to pass through the upper surface 260 to impinge upon a substrate or substrate support. An opening 262 is disposed above each of the lamps 142. In addition to allowing radiant energy to pass therethrough, the openings 262 induce a turbulent flow within a cooling fluid as the cooling fluid passes between the upper surface 260 and bottom surface of a lower dome, such as optically transparent window 104 shown in FIG. 1. The turbulent flow of the cooling fluid increases thermal coupling between a lower dome and cooling channels 149 formed within the lamp housing 250A. Thus, thermal energy can quickly be removed from a lower dome, particularly compared to when the lower dome is cooled by stagnant, ambient air. The rapid reduction in the temperature of the lower dome facilitates a reduction in substrate cool down time, because radiant heating of the substrate by the lower dome is decreased.

While a laminar flow of the cooling fluid between the lamp housing 250A and a lower dome would also remove heat from the lower dome, the turbulent flow increases heat transfer due to convection of the cooling fluid. Because heat transfer through the cooling fluid is increased due to a turbulent flow of the cooling fluid, a cooling fluid with a lower thermal conductivity may be utilized while still providing sufficient cooling. A cooling fluid with a lower thermal conductivity may be desired when such a cooling fluid is cost efficient. One such cost efficient cooling fluid may be atmospheric air.

FIG. 2A illustrates one embodiment; however, other embodiments are also contemplated. For example, it is contemplated that features other than openings 262 may be used in addition to or as an alternative to the openings 262 to induce a turbulent flow of the cooling fluid. For example, features such as ridges or bumps may be utilized to induce a turbulent flow to a cooling fluid.

Figure 2B:
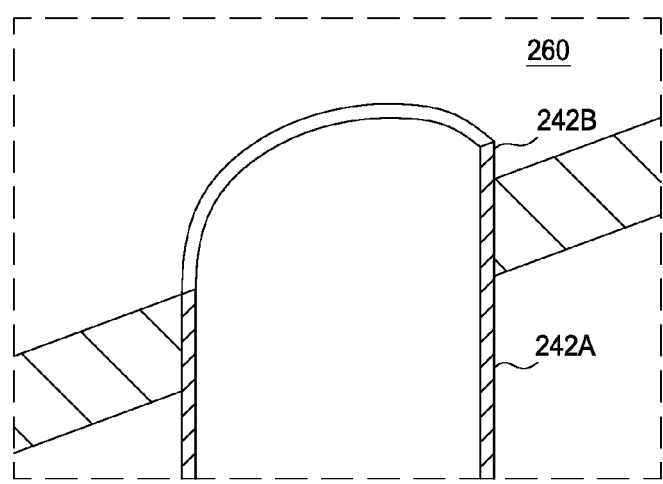
FIG. 2B is an enlarged view of a reflector, according to one embodiment of the invention.

FIG. 2B illustrates an alternative embodiment of a reflector 242A. The reflector 242A is similar to reflector 142A, except that the reflector 242A includes an extended portion 242B that projects above the surface 260 of the lamp housing. The extended portion 242B of the reflector 242A facilitates increased turbulence of the cooling fluid flowing thereover, thus increasing heat transfer from optically transparent window 104 to the lamp housing. It is contemplated that the number of reflectors 242A having an extended portion 242B may be selected to generate the desired turbulence of the cooling fluid, and thus, not each reflector 242A may have an extended portion 242B. However, it is to be understood that more than one reflector may include an extended portion 242B, although only one is shown for clarity. In one example, each lamp 142 may include a reflector 242A having an extended portion 242B. In some embodiments, it is contemplated that the extended portions 242B may be in contact with a lower surface of the optically transparent window 104. In the embodiment shown in FIG. 2B, the extended portion 242B includes a conical section, however, other shapes are also contemplated.

Figure 3A:
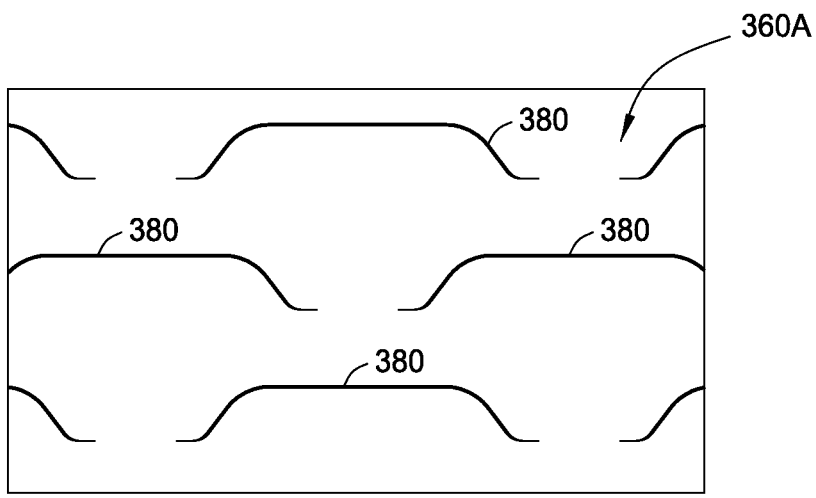
FIGS. 3A-3C illustrate enlarged schematic views of an upper surface of a lamp housing, according to embodiments of the invention.
Figure 3B:
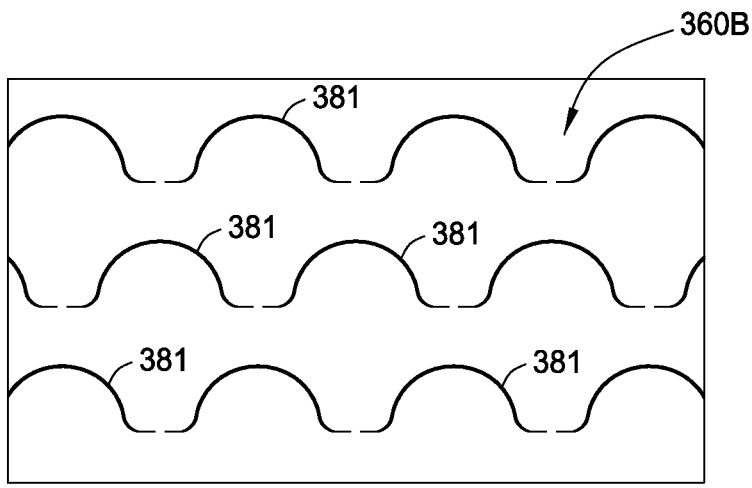
Figure 3C:
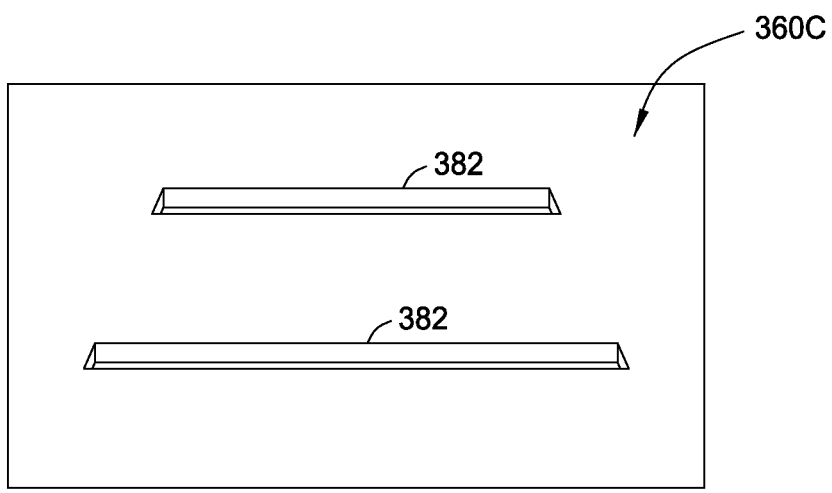

FIGS. 3A-3C illustrate enlarged schematic views of an upper surface of a lamp housing having additional turbulence inducing features thereon, according to embodiments of the invention. FIG. 3A illustrates an upper surface 360A, which is similar to the upper surface 260. The upper surface 360A includes a plurality of ridges 380 extending therefrom to facilitate turbulent flow of a cooling fluid as the cooling fluid flows thereover. The ridges 380 may have a length of several millimeters to several centimeters, or more, and a height limited to the spacing between the upper surface 360A and a lower surface of the optically transparent window 104. In one embodiment, it is contemplated that the ridges 380 may be in contact with the optically transparent window 104.

FIG. 3B illustrates an upper surface 360B, which is similar to the upper surface 260. The upper surface 360B includes a plurality of bumps 381 extending therefrom to facilitate turbulent flow of a cooling fluid as the cooling fluid flows thereover. The bumps 381 may have a diameter of a millimeter to several millimeters, or more, and a height limited to the spacing between the upper surface 360B and a lower surface of the optically transparent window 104. In one embodiment, it is contemplated that the bumps 381 may be in contact with the optically transparent window 104. Additionally, the bumps 381 may be formed by texturing the surface 360B, for example by exposure to an etchant. Alternatively, the bumps 381 may be part of the natural surface roughness of an unpolished or unfinished surface.

FIG. 3C illustrates an upper surface 360C, which is similar to the upper surface 260. The upper surface 360C includes one or more channels 382 formed therein to facilitate turbulent flow of a cooling fluid as the cooling fluid flows thereover. The channels 382 may have a length ranging from several millimeters to several centimeters, or more. In one example, a channel 382 may extend continuously around the upper surface 360C. The channel 382 may have a depth with a range of about 0.5 millimeters to about 3 millimeters, or more.

FIGS. 3A-3C illustrate embodiments of turbulence inducing features, however, additional or alternative turbulence inducing features are also contemplated. Also, the sizes of the turbulence inducing features, and the spacing between the optically transparent window 104 and the lamp head, may be selected to create a localized recirculation to maximize heat transfer between the optically transparent window 104 and the lamp head.

Cooling fluids suitable for use herein generally include one or more highly conductive gases, including helium, hydrogen, and nitrogen. However, additional gases are contemplated. For example, it is contemplated ambient air, filtered ambient air, and clean, dry air (CDA) may also be utilized. Furthermore, it is contemplated that in some embodiments, one or more liquid coolants, such as water or oils, may be utilized.

Benefits of embodiments described herein include increased cooling of chamber components and substrates. The increased cooling is facilitated by thermally coupling the lower dome to cooling channels disposed within a lamp housing cooling fluid. The lamp housing includes features that induce a turbulent flow to the cooling fluid, thus increasing heat transfer between the lower dome and the cooling channels within the lamp housing. The increased heat transfer due to the turbulent flow allows a less expensive cooling fluid having a lower heat transfer coefficient to be utilized during processing.

While the foregoing is directed to embodiments of the present invention, other and further embodiments of the invention may be devised without departing from the basic scope thereof, and the scope thereof is determined by the claims that follow.

What is claimed is:
1. A process chamber, comprising:
   a chamber body including an optically transparent window;

a lamp housing having an upper surface disposed adjacent to the optically transparent window, the lamp housing having a plurality of openings formed within the upper surface of the lamp housing, the optically transparent window and the lamp housing having a gap therebetween, wherein the upper surface of the lamp housing comprises turbulence-inducing features adjacent the gap, the turbulence-inducing features including bumps or ridges;

a plurality of lamps disposed within the lamp housing and positioned to direct radiant energy through the plurality of openings formed within the upper surface of the lamp housing;

one or more cooling channels disposed within the lamp housing, the one or more cooling channels defined between the plurality of lamps and the upper surface of the lamp housing, the upper surface of the lamp housing disposed between the one or more cooling channels and the gap; and a temperature control unit adapted to provide a cooling fluid to the gap between the optically transparent window and the lamp housing.

2. The process chamber of claim 1, wherein the lamp housing comprises copper or aluminum.

3. The process chamber of claim 1, wherein the temperature control unit includes a heat exchanger.

4. The process chamber of claim 1, wherein the temperature control unit includes a forced induction unit.

5. The process chamber of claim 1, wherein the optically transparent window is a lower dome.

6. The process chamber of claim 1, wherein the optically transparent window comprises quartz.

7. The process chamber of claim 6, wherein the gap has a size of about 0.5 millimeters to about 10 millimeters.

8. The process chamber or claim 6, wherein each lamp comprises a bulb surrounded by a reflector.

9. A process chamber, comprising:
a chamber body including an optically transparent window;
a lamp housing having an upper surface disposed adjacent to the optically transparent window, the lamp housing having a plurality of openings formed within the upper surface of the lamp housing, the optically transparent window and the lamp housing having a gap therebetween, wherein the upper surface of the lamp housing comprises turbulence-inducing features adjacent the gap, the turbulence-inducing features including bumps or ridges;
a plurality of lamps disposed within the lamp housing and positioned to direct radiant energy through the plurality of openings formed in the upper surface of the lamp housing, wherein each lamp comprises a bulb surrounded by a reflector;
one or more cooling channels disposed within the lamp housing, the one or more cooling channels defined between the plurality of lamps and the upper surface of the lamp housing, the upper surface of the lamp housing disposed between the one or more cooling channels and the gap; and
a temperature control unit adapted to provide a cooling fluid to the gap between the optically transparent window and the lamp housing.

10. The process chamber of claim 9, wherein the optically transparent window is a lower dome.

11. The process chamber of claim 10, wherein the gap has a size of about 0.5 millimeters to about 10 millimeters.

12. The process chamber of claim 11, wherein the turbulence-inducing features include bumps or ridges formed on the upper surface of the lamp housing.

13. A process chamber, comprising:
a chamber body including an optically transparent window;
a lamp housing having an upper surface disposed adjacent to the optically transparent window, the upper surface having a plurality of openings formed within the lamp housing, the optically transparent window and the lamp housing having a gap therebetween, the gap having a size of about 0.5 millimeters to about 10 millimeters, wherein the upper surface of the lamp housing comprises turbulence-inducing features adjacent the gap, the turbulence-inducing features including bumps or ridges;
a plurality of lamps disposed within the lamp housing and positioned to direct radiant energy through the plurality of openings formed in the upper surface of the lamp housing, wherein each lamp comprises a bulb surrounded by a reflector;
one or more cooling channels disposed within the lamp housing, the one or more cooling channels defined between the plurality of lamps and the upper surface of the lamp housing, the upper surface of the lamp housing disposed between the one or more cooling channels and the gap; and
a temperature control unit adapted to provide a cooling fluid to the gap between the optically transparent window and the lamp housing.

14. The process chamber of claim 13, wherein the temperature control unit includes a heat exchanger.

15. The process chamber of claim 14, wherein the temperature control unit includes a forced induction unit.

* * * * *